(12) United States Patent
Bett et al.

(10) Patent No.: US 12,506,092 B2
(45) Date of Patent: Dec. 23, 2025

(54) SCALABLE METHOD FOR SECURITY BARRIERS

(71) Applicant: Raytheon Company, Waltham, MA (US)

(72) Inventors: Christopher J. Bett, Wakefield, MA (US); Nathan C. Brown, Cambridge, MA (US); Craig Alfred Armiento, Acton, MA (US); Peter Alexander Bellus, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 488 days.

(21) Appl. No.: 18/315,035

(22) Filed: May 10, 2023

(65) Prior Publication Data

US 2024/0379582 A1 Nov. 14, 2024

(51) Int. Cl.
| | | |
|---|---|---|
| H01L 23/00 | (2006.01) | |
| H01L 21/02 | (2006.01) | |
| H01L 21/768 | (2006.01) | |
| H05K 1/02 | (2006.01) | |
| H05K 3/10 | (2006.01) | |

(52) U.S. Cl.
CPC ........ *H01L 23/57* (2013.01); *H01L 21/02354* (2013.01); *H01L 21/0254* (2013.01); *H01L 21/02601* (2013.01); *H01L 21/76823* (2013.01); *H05K 1/0275* (2013.01); *H05K 3/105* (2013.01)

(58) Field of Classification Search
CPC ...... H01L 21/76823; H01L 23/57–576; H05K 1/0275; H05K 3/105
See application file for complete search history.

(56) References Cited

U.S. PATENT DOCUMENTS

| | | | | |
|---|---|---|---|---|
| 4,694,138 | A * | 9/1987 | Oodaira | .............. H01L 21/4867 438/618 |
| 5,468,990 | A * | 11/1995 | Daum | ................... H01L 23/573 257/632 |
| 7,054,162 | B2 | 5/2006 | Benson et al. | |
| 8,211,538 | B2 | 7/2012 | Heffner | |

(Continued)

FOREIGN PATENT DOCUMENTS

| | | |
|---|---|---|
| WO | 2004102662 A1 | 11/2004 |
| WO | 2021158610 A1 | 8/2021 |

OTHER PUBLICATIONS

Notification of Transmittal of the International Search Report and the Written Opinion of the International Searching Authority, or the Declaration; PCT/US2024/026789; Sep. 9, 2024, 13 pages.

(Continued)

*Primary Examiner* — Bryan R Junge
(74) *Attorney, Agent, or Firm* — CANTOR COLBURN LLP

(57) ABSTRACT

A method is provided to form a security barrier of an electronic device under protection. The method includes depositing a transformable dielectric material layer on the electronic device under protection, and converting a target portion of the transformable dielectric material layer into at least one electrical circuit structure having at least one measurable electrical characteristic. The method further includes depositing a thermal stabilizing material layer onto the transformable dielectric material layer.

20 Claims, 10 Drawing Sheets

(56) References Cited

U.S. PATENT DOCUMENTS

| | | |
|---|---|---|
| 8,659,908 B2 | 2/2014 | Adams et al. |
| 9,663,699 B2 * | 5/2017 | Lindberg ................. C09K 5/08 |
| 11,250,171 B1 | 2/2022 | Cook et al. |
| 2016/0230025 A1 * | 8/2016 | Cappelli ................. H05K 3/105 |
| 2018/0276419 A1 * | 9/2018 | Bartley ................... G06F 21/87 |
| 2020/0170125 A1 * | 5/2020 | Saito ........................ H05K 3/10 |
| 2020/0328162 A1 * | 10/2020 | Haba ....................... H01L 24/83 |
| 2020/0328163 A1 * | 10/2020 | Best ....................... H01L 23/573 |
| 2022/0220331 A1 * | 7/2022 | Ranasingha ............. H05K 1/00 |
| 2023/0056201 A1 | 2/2023 | Kingsley et al. |
| 2023/0113929 A1 | 4/2023 | Armiento et al. |

OTHER PUBLICATIONS

Ranasingha, et al., "Selective laser sintering of conductive patterns on a novel silver-barium strontium titanate composite material" Flexible and Printed Electronics 5.4 (Dec. 2020): 045007 Abstract Only (1 page).

\* cited by examiner

SCALABLE METHOD FOR SECURITY BARRIERS

BACKGROUND

The present disclosure relates to anti-tampering technologies, and more specifically, to protective physical barriers with measurable electrical characteristics that are capable of indicating unauthorized access to inspect and/or modify devices under protection. Inspection may include, for example, imaging for purposes of counterfeiting devices under protection. Modification may include, for example, replacement of components with counterfeit components that can have inferior performance and quality. Modification may also include instrumentation for purposes of recording intellectual property embodied as software, firmware, or data resident in the devices under protection. For example, a counterfeit device may be installed with malware that gathers information unbeknown to the product owner. Indication of unauthorized access may be used, for example, to assess system integrity, as evidence of intellectual property theft; or to signal a gap in device provenance.

SUMMARY

According to a non-limiting embodiment, a method is provided to form a security barrier of an electronic device under protection. The method includes depositing a transformable dielectric material layer on the electronic device under protection, and converting a target portion of the transformable dielectric material layer into at least one electrical circuit structure having at least one measurable electrical characteristic. The method further includes depositing a thermal stabilizing material layer onto the transformable dielectric material layer.

According to any prior embodiment, forming the security barrier includes establishing a blended ratio of electrically conductive nanoparticles and electrically insulative nanoparticles in the transformable dielectric material layer.

According to any prior embodiment, the electrically conductive nanoparticles include silver (Ag) nanoparticles and the electrically insulative nanoparticles include barium strontium titanate (BST) nanoparticles.

According to any prior embodiment, the transformable dielectric material layer is cured at 80 degrees Celsius for 15 minutes.

According to any prior embodiment, converting the target portion of the transformable dielectric material layer comprises performing a selective laser sintering (SLS) process to impinge laser energy on the transformable dielectric material layer to convert the target portion into the at least one electrical circuit structure.

According to any prior embodiment, the laser energy melts the electrically conductive nanoparticles together to form an electrically conductive path defining the at least one electrical circuit structure.

According to any prior embodiment, the electrically insulative nanoparticles electrically isolate the at least one electrical circuit structure from remaining portions of the transformable dielectric material layer.

According to any prior embodiment, the thermal stabilizing material layer includes nanoparticles that obstruct the formation of additional conducting paths within the transformable dielectric material layer.

According to any prior embodiment, the nanoparticles include Boron Nitride (BN) nanoparticles.

According to any prior embodiment, the thermal stabilizing material layer reduces at least one of an amount and a size of air voids present in the transformable dielectric material layer.

According to any prior embodiment, reducing the amount of air voids includes filling the air voids with polymerized trimethylolpropane ethoxylate triacrylate.

According to any prior embodiment, the thermal stabilizing layer is cured through ultraviolet (UV) exposure to inhibit further changes to the security barrier layer at temperatures below 250 degrees Celsius.

According to a non-limiting embodiment, a security barrier of an electronic device under protection is provided. The security barrier comprises a transformable dielectric material layer on the electronic device under protection. The transformable dielectric material layer includes a plurality of conductive nanoparticles and a plurality of insulative nanoparticles. The security barrier further includes at least one electrical circuit structure and a thermal stabilizing material layer. The at least one electrical circuit structure comprises a portion of the conductive nanoparticles, and has at least one measurable electrical characteristic. The thermal stabilizing material layer covers the transformable dielectric material layer, including the at least one electrical circuit structure.

According to any prior embodiment, the at least one measurable electrical characteristic changes in response to altering the electrical circuit structure.

According to any prior embodiment, the at least one measurable electrical characteristic includes at least one of resistance, capacitance, and inductance.

According to any prior embodiment, the at least one electrical circuit structure is at a target portion of the transformable dielectric material layer, and the insulative nanoparticles electrically isolate the at least one electrical circuit structure from remaining portions of the transformable dielectric material layer.

According to any prior embodiment, the transformable dielectric material layer includes other electrical circuit structures.

According to any prior embodiment, the conductive nanoparticles include silver (Ag) nanoparticles, and the insulative nanoparticles include barium strontium titanate (BST) nanoparticles.

According to any prior embodiment, the thermal stabilizing material layer comprises a boron nitride (BN) material and a polymerized trimethylolpropane ethoxylate triacrylate material.

According to any prior embodiment, the transformable dielectric material layer and thermal stabilizing layer are combined to establish a composite substrate including a combination of Ag particles, BST particles, and BN particles.

Additional features and advantages are realized through the techniques of the present disclosure. Other embodiments and aspects are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
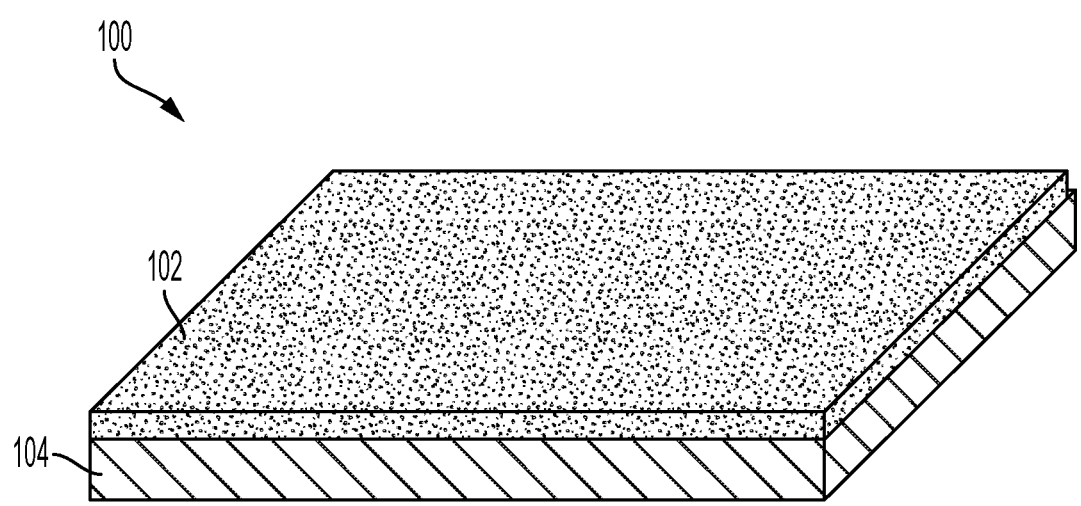
FIG. 1A depicts an electronic device following deposition of a transformable dielectric material layer according to a non-limiting embodiment of the present disclosure.

Prior solutions to creating security barriers with measurable electrical characteristics fall into two categories: (1) attaching pre-fabricated security barriers to the electronics assembly containing the devices under protection; or (2) depositing one or more layers of materials that in combination form a security barrier covering the devices under protection. Solutions of the first category typically prefabricate, separately, a physical structure containing electrical circuit elements (and possibly other features) and attach (mechanically and electrically) the prefabricated structure to a circuit card assembly (CCA) to cover or enclose the target devices and interconnects. The first category of approaches also typically requires design customization of the electronics assembly containing the devices under protection in order to incorporate the electrical and mechanical interfaces to the prefabricated cover. Practical application of the first category of approaches is currently limited to CCA-scale barrier structures; but application could expand to include barrier structures attached through 3-dimensional heterogeneous integration (3DHI) manufacturing methods. Size, weight, power, and cost (SWaP-C) considerations may limit utility of this first category of solutions.

Solutions of the second category typically utilize material layers (possibly containing electrical circuit elements and other features) which are deposited through a fabrication or manufacturing process to cover or enclose the target devices and interconnects. One or more layers in combination exhibit measurable electrical/mechanical characteristics that are used to form the protective barrier for the devices under protection. The deposition methods utilized by solutions of the second category widely vary and include, for example, 3D printing of conductive or resistive inks to create circuit structures and photolithography to deposit metal layers in integrated circuit fabrication process.

Various non-limiting embodiments of the present disclosure provide protective physical barriers with measurable electrical characteristics that are capable of indicating unauthorized access to inspect and/or modify devices under protection, and method of fabricating the same. The security barrier comprises a transformable or convertible dielectric material such as, for example, Silver-Barium-Strontium-Titanate (Ag-BST) ink. A sintering process is then applied to the convertible dielectric material to convert selected portions from dielectric material into an electrically conductive structure or structures which have measurable electrical properties such as resistance, capacitance, or inductance that can be incorporated into an electrical circuit. The sintering process may be accomplished, for example, with laser energy. The sintering process is targeted to create electrically conductive structure(s) such that tampering or other unauthorized efforts to physically access the devices under protection will change or damage the structure(s), thereby altering electrical properties of the structure(s) in a measurable way. Electrical properties of the structures formed by the aforementioned process can be measured by various means, for example, by incorporating the structures into an electrical circuit and comparing the electrical response of the circuit to its expected electrical response (established at initial fabrication). In this manner, the present disclosure provides a method for creating security barriers by selectively converting portions of a dielectric material layer into electrically conductive structures with measurable electrical properties that are changed if a bad actor attempts to access devices under protection.

The security barrier method described herein scales to individually solve a broader range of problems than previously known methods are able to individually solve. In terms of size, for example, material properties of the aforementioned dielectric ink layer permit sintering into electrically conductive structures to create security barriers for small devices, such as security barrier covering semiconductor die backside, as well as larger assemblies, such as single board computers or CCAs. One or more methods described herein can be applied to various electrical devices and components including, but not limited to, microelectronics fabrication wafers, dies attached to a substrate, printed circuit board (PCB) layers, packaged (lidded) components, and CCAs and can be used to create security barriers for commercial-off-the-shelf (COTS) devices or assemblies as well as custom microelectronic devices or assemblies. In terms of product lifecycle, for example, the method might be applied during microelectronics wafer processing, during PCB fabrication steps (to form a security barrier beneath a device), or to finished microelectronics assemblies. In addition, for a single microelectronics assembly or device, the method scales to permit creation of a single security barrier or multiple, spatially distributed security barriers of different sizes. Also, because converted circuit variations can be controlled through the sintering process (e.g., the software used by the sintering tool), part-to-part variations can be achieved at the component-to-component level at wafer fabrication as well as CCA-to-CCA level.

Figure 1B:
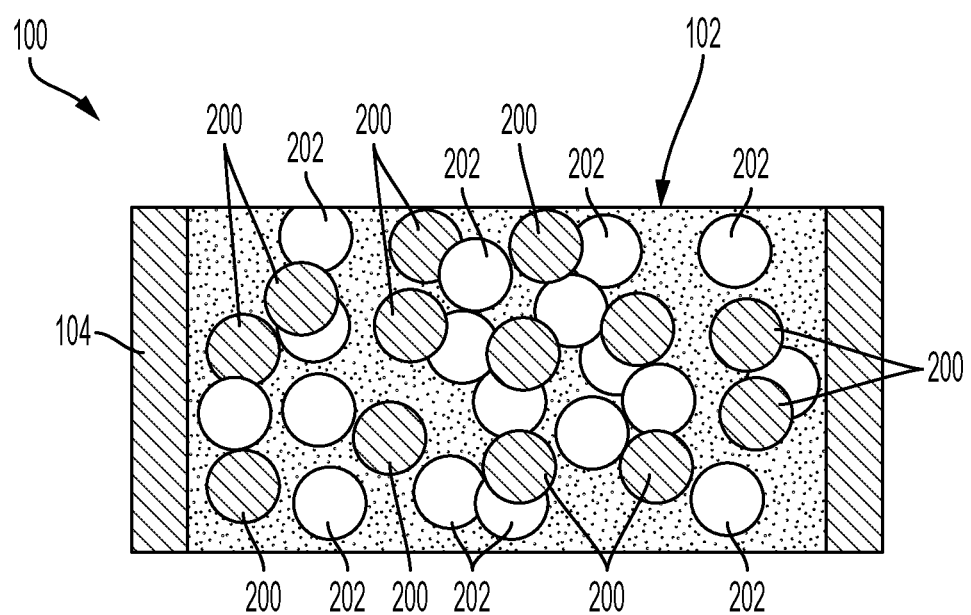
FIG. 1B depicts the transformable dielectric material layer formed on a surface of the electrical device according to a non-limiting embodiment of the present disclosure.

Turning now to FIGS. 1A and 1B, an electronic device 100 following deposition of a transformable dielectric material 102 onto a surface 104 is illustrated according to a non-limiting embodiment of the present disclosure. As described herein, the treated electronic device 100 can include, but is not limited to, microelectronics fabrication wafers, dies attached to a substrate, PCB layers, packaged and/or lidded components, integrated circuit (IC) chips, and circuit card assemblies.

In FIGS. 1A and 1B, the transformable dielectric material 102 is shown in a "insulating phase," which exists prior to applying a sintering process as described in greater detail below. Various deposition methods can be used to deposit the transformable dielectric material onto the electronic device surface 104 including, but not limited to, direct write printing, spin coating or spraying. Although a single layer of transformable dielectric material 102 is shown, it should be appreciated that additional transformable dielectric material layers can be deposited on the device 100 without departing from the scope of the invention.

With continued reference to FIG. 1B, the transformable dielectric material is also referred to as a "transformable ink" or "composite functional ink." In one or more non-limiting embodiments, the transformable dielectric material is a silver-barium strontium titanate (Ag-BST) composite ink, which includes a blended ratio of electrically conductive silver (Ag) nanoparticles 200 and electrically insulative barium strontium titanate (BST) nanoparticles 202. According to a non-limiting embodiment, the Ag nanoparticles 200 can have a size ranging, for example, from about 75 nanometers (nm) to about 85 nm, and the BST nanoparticles 202 can have size ranging, for example, from about 80 nm to about 100 nm. In one or more non-limiting embodiments, the blending ratio of the Ag nanoparticles 200 and the BST nanoparticles 202 can be optimized to obtain the insulating phase when initially deposited on the surface 104 and having undergone a curing process (e.g., cured at 80 degrees Celsius for about 15 minutes) to stabilized the arrangement of Ag nanoparticles 200 and the BST nanoparticles 202.

Figure 2A:
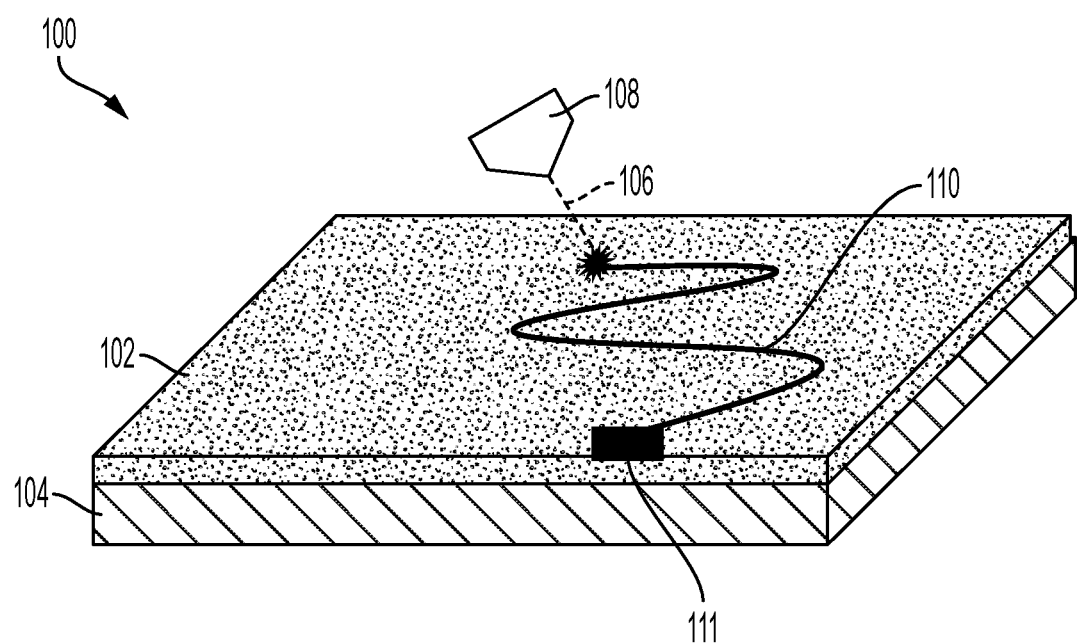
FIG. 2A depicts the transformable dielectric material of FIG. 1 undergoing a laser sintering process that is applied to the transformable dielectric material layer to convert a portion of the transformable dielectric material layer into an electrical circuit structure according to a non-limiting embodiment of the present disclosure.
Figure 2B:
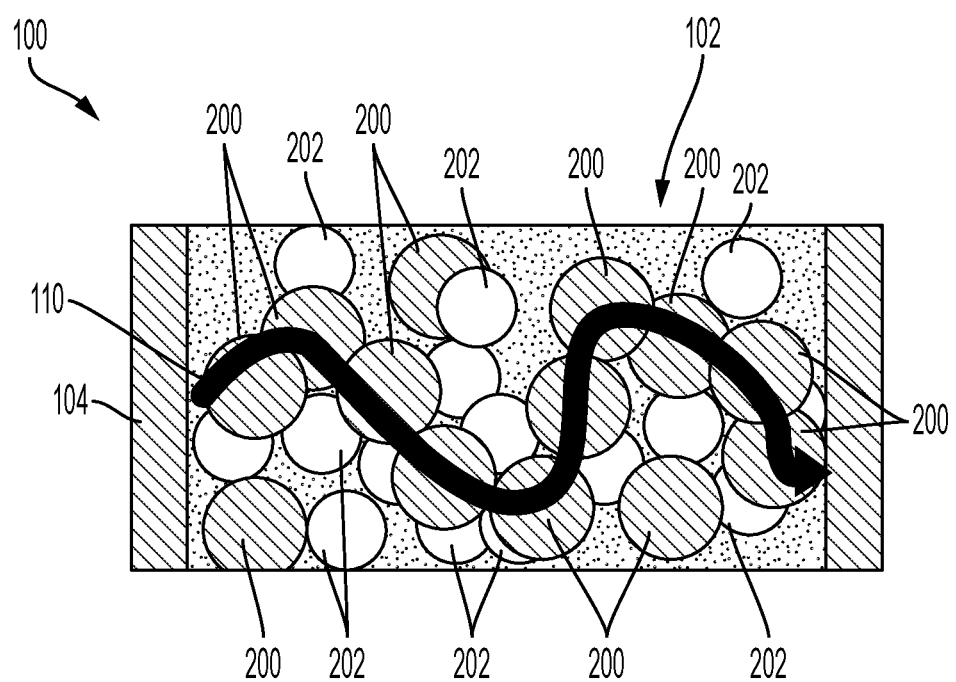
FIG. 2B depicts the transformable dielectric material layer following the laser sintering process that converts a portion of the transformable dielectric material layer into the electrical circuit structure according to a non-limiting embodiment of the present disclosure.
Figure 2C:
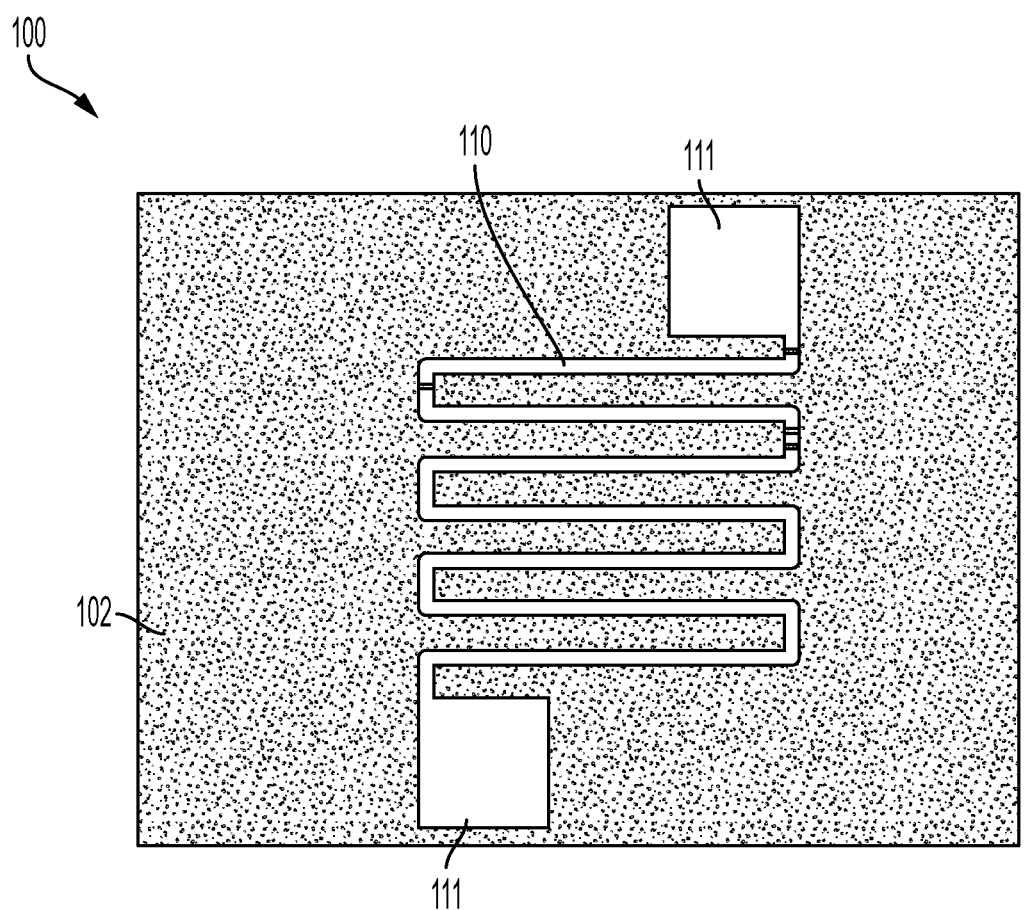
FIG. 2C depicts an example of the electrical circuit structure that is a converted portion of the transformable dielectric material layer according to a non-limiting embodiment according to the present disclosure.

Turning to FIG. 2A, the transformable dielectric material 102 is shown undergoing a sintering process after which sintered material achieves a "highly conductive phase". The sinter process can include a selective laser sintering (SLS) process, which impinges laser energy 106 output from a laser sintering tool 108 on to selected or targeted portions of the transformable dielectric material 102. The laser energy 106 creates temperatures exceeding 150 degrees Celsius (about 300 degrees Fahrenheit) at targeted points on the transformable dielectric material 102, causing Ag nanoparticles 200 to melt and coalesce, thereby converting the heated portions from an electrically insulating phase to an electrically conductive phase, as shown in FIG. 2B. Accordingly, the selectively converted portions of the transformable dielectric material 102 form conductive traces 110 having various measurable electrical properties such as, for example, resistance, capacitance, or inductance that can be incorporated into an electrical circuit. FIG. 2C illustrates the transformable dielectric material 102 following the laser sintering process. As shown, a targeted portion of the transformable dielectric material is converted into a meandering profile conductive trace 110 that forms a resistor.

As discussed herein, the measurable electrical properties of the conductive traces 110 are derived from physical characteristics of the traces (e.g., line width, line thickness) such that if the conductive traces 110 are altered by tampering or other source of damage, a measurable change to the electrical properties of the conductive traces 110 will occur. In this manner, a security barrier is formed when the sintering process is used to convert portions of the transformable dielectric material 102 into conductive traces 110 that cover devices under protection such that unauthorized physical access to the devices under protection alter the physical characteristics of the traces 110, thereby altering their electrical properties in a measurable way. Although a single conductive trace 110 is shown, it should be appreciated that additional conductive traces can be formed from the transformable dielectric material 102 without departing from the scope of the invention. In addition to the conductive trace, one or more conductive pads 111 can be optionally formed using the method of forming the conductive trace described herein. The conductive pads 111 can provide access to electrical measurement tools (e.g., an ohmmeter) for facilitating measurement of the electrical properties of a given traces 110. The conductive pads 111 depicted here represent one example of using the method of forming the conductive trace described herein to electrically connect the conductive trace to other electrical or electronic devices. In one or more non-limiting embodiments, the SLS process described herein can be used to form conductive traces, which electrically connect to a preexisting pad on the underlying device 104.

In one or more non-limiting embodiments, the laser sintering tool 108 can store design layouts that control the operation of the laser sintering tool 108. In addition, operating parameters of the laser sintering tool 108 such as laser energy power, laser wavelength, raster speed, for example, can be adjusted when forming the electrical circuit structures. In this manner, the electrical properties of the conductive traces 110 can be tuned to achieve target electrical properties. In addition, the target areas and/or the designs of the conductive traces 110 can be selected and formed accordingly. Thus, different types of conductive traces with different types of shapes and profiles can be formed.

In one or more non-limiting embodiments, adjusting the sintering tool operating parameters permits wider and/or thicker portions of the conductive traces. Traces can be designed to create complex impedances and/or can connect to discrete electronic components that are part of the assembly. The operating parameters can also be adjusted to allow for configurability of line width, spacing, trace thickness, yielding arbitrarily unique barrier structures that can be leveraged in authentication (integrity) and/or confidentiality strategies. The sintering tool 108 can also be programmed (e.g., using software) to perform patterned laser scans, which can be dynamically changed and quickly modified for part-to-part variations.

Figure 3A:
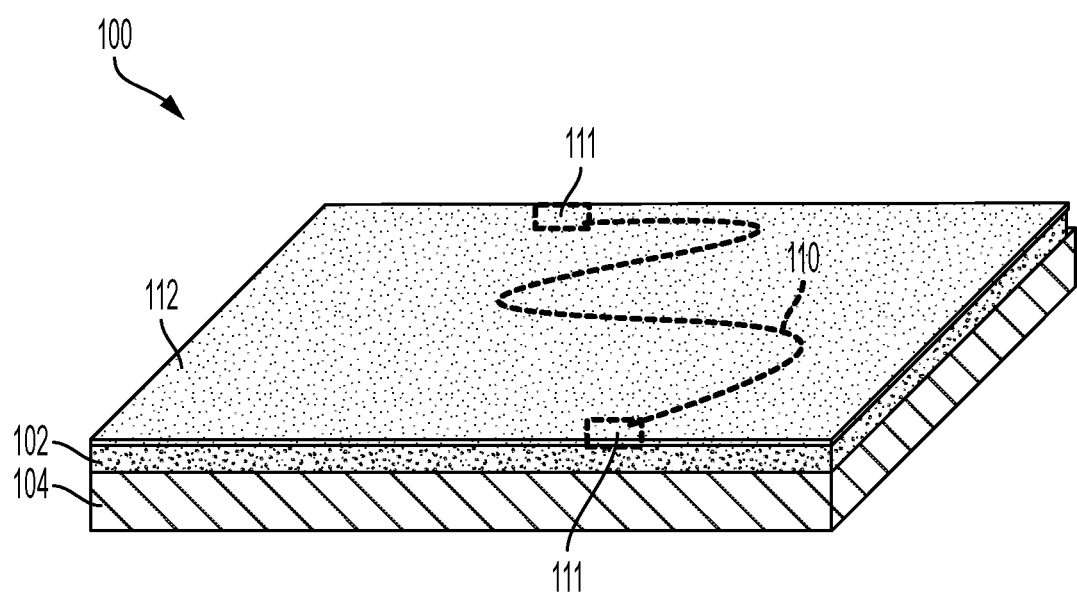
FIG. 3A depicts the electrical circuit structure of FIG. 2 following deposition of a thermal stabilizing ink on the transformable dielectric material layer with the electrical circuit structure according to a non-limiting embodiment of the present disclosure.
Figure 3B:
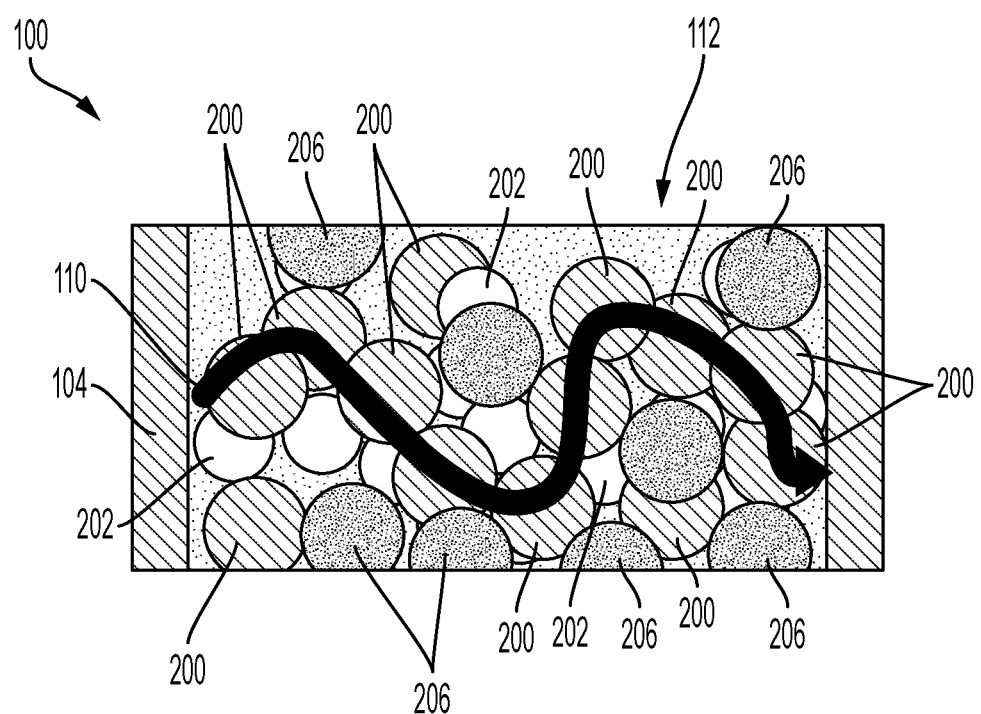
FIG. 3B depicts a thermal stabilizing ink deposited on the transformable dielectric material layer with the electrical circuit structure and following a curing process.

Turning now to FIGS. 3A and 3B, the security barrier of FIG. 2 is illustrated following deposition of a thermal stabilizing ink 112 on the transformable dielectric material 102 and conductive traces 110. The thermal stabilizing ink 112 is formed from various non-conductive, thermally resistant materials such as, for example, boron nitride (BN), comprising nanoparticles that fill most air voids in the barrier layer containing the transformable dielectric material 102 and conductive traces 110. The thermal stabilizing ink 112 can be deposited using various deposition techniques such as, for example, direct write printing, spin coating or spraying. Once deposited, the thermal stabilizing ink 112 undergoes a curing process to cure the thermal stabilizing ink 112. The curing process for the thermal stabilizing ink 112 can be achieved by exposing the thermal stabilizing ink 112 to ultraviolet (UV) energy. Curing the thermal stabilizing ink 112 prevents changes to the transformable dielectric material 102 and conductive traces 110 caused by subsequent exposure to high temperatures (e.g., solder reflow).

Referring to FIG. 3B, the cured thermal stabilizing ink 112 is illustrated in greater detail. In this example, the thermal stabilizing ink 112 introduces larger BN particles 206 into the air voids in the transformable dielectric material 102 with conductive traces 110. Once cured, the BN nanoparticles prevent further melting and coalescing of Ag nanoparticles, thereby obstructing formation of additional conductive paths at locations not initially targeted by the initial SLS process, e.g., non-SLS treated regions of the transformable dielectric material 102, that might be caused, for example, by subsequent heat exposure. Accordingly, the combination of the thermal stabilizing ink 112 and the transformable dielectric material 102 establishes a composite substrate including a combination of Ag particles 200, BST particles 202, and BN particles 206.

The UV-cured thermal stabilizing ink reduces the amount of air voids present in the transformable dielectric material layer 102 by filling the air voids with polymerized trimethylolpropane ethoxylate triacrylate, thereby minimizing the possibility of increasing the particle sizes of the AG nanoparticles 200 that can occur when exposing the thermal insulation film 112 to subsequent heat sources.

As described herein, the electrical circuit structure 110 created by selectively converting the transformable dielectric material layer has measurable electrical properties (e.g., resistance, capacitance, current output, voltage output, etc.) that are altered when the electrical circuit structures within the barrier layer 110 are damaged, tampered with, and/or compromised. In this manner, the properties of the electrical circuit structures 110 can be measured and compared to its expected electrical properties (e.g., measured at initial fabrication of the electrical device) to detect tampering of the electrical device 100.

In one or more non-limiting embodiments, the electrical characteristics or properties of the conductive traces 110 can be measured by connecting the traces and possibly other circuit elements to a logic device (not shown), which is programmed to excite the resulting electrical circuit and measure its electrical response. Accordingly, the resulting subsystem could be used to compare responses measured at some point during the system lifecycle with the measured response recorded at manufacture.

Figure 4A:
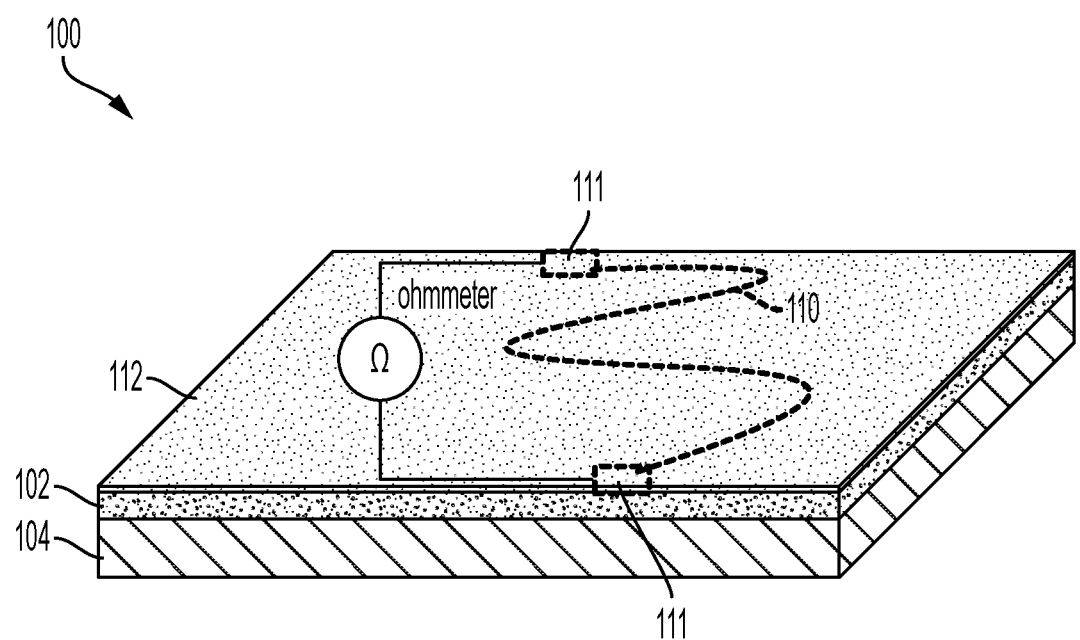
FIG. 4A depicts measurement of the converted electrical circuit structure existing in a non-tampered barrier layer according to a non-limiting embodiment of the present disclosure.
Figure 4B:
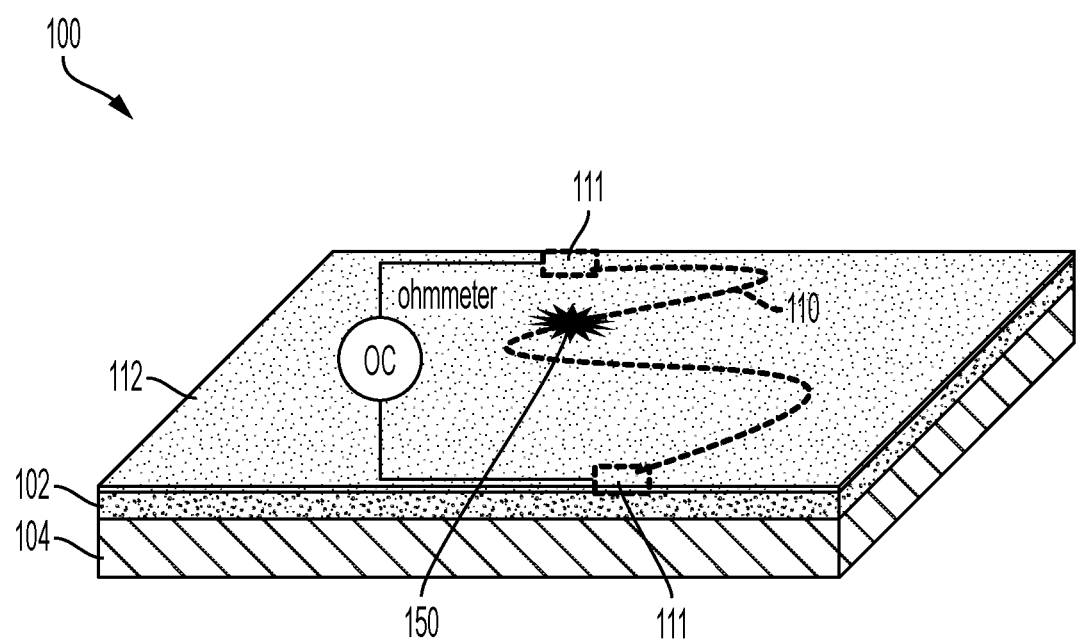
FIG. 4B depicts measurement of the converted electrical circuit structure existing in a tampered barrier layer according to a non-limiting embodiment of the present disclosure.

According to another embodiment, the conductive traces 110 can be designed so that electrical instrumentation (e.g., probe, ohm meter, volt meter, etc.) can be used to detect open or short circuits that were not present during initial fabrication of the electronic device 100. FIG. 4A, for example, depicts the ohmmeter measurement of an intact conductive trace 110 existing in a non-tampered barrier layer 102. In this example, the intact conductive trace 110 provides a finite resistance measurement, (2. FIG. 4B, however, depicts ohmmeter measurement of conductive traces 110 that have been damaged by a tamper event 150. In this example, the ohmmeter signals the damaged conductive trace as an open circuit (OC). Accordingly, it can be determined that unauthorized tampering with and/or damage to the electrical device 100 has occurred. It should be appreciated that the damage caused by the tamper event could have resulted in a change in the measured resistance from its original value to a different finite value, or that a different electrical measurement method would result in an analogous change to the measured values cause by the tamper event 150.

Figure 5:
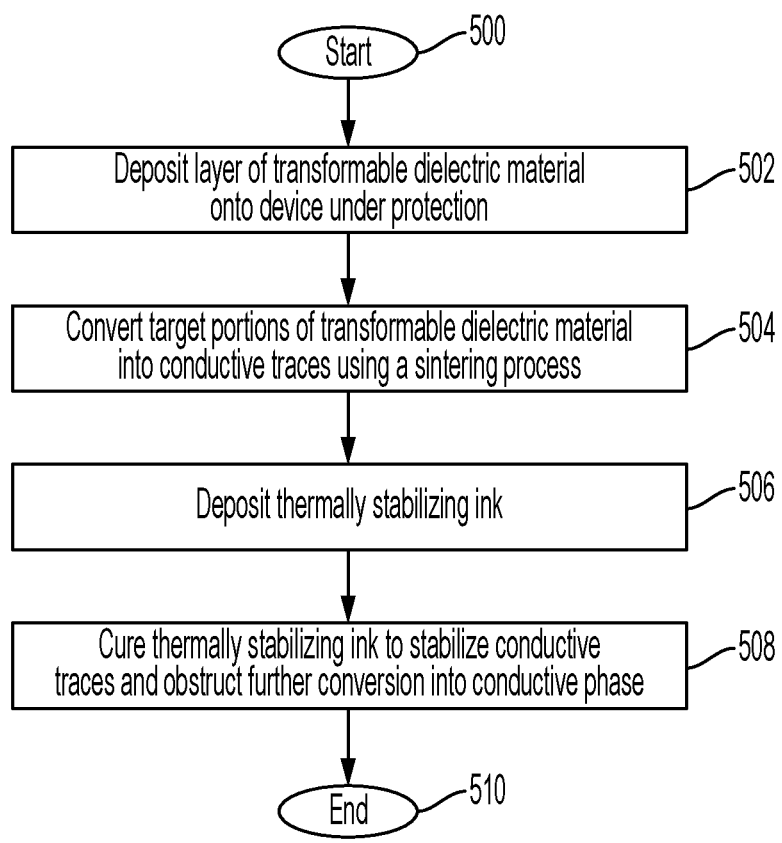
FIG. 5 is a flow diagram illustrating a method of fabricating a security barrier layer according to a non-limiting embodiment of the present disclosure.

Turning now to FIG. 5, a method of fabricating a security barrier is illustrated according to a non-limiting embodiment of the present disclosure. The method begins at operation 500, and at operation 502 a layer of transformable dielectric material is deposited onto the device under protection. As described herein, the layer is formed from a transformable Ag-BST composite ink cured at 80 degrees Celsius for approximately 15 minutes. At operation 504, one or more targeted portions of the barrier layer are converted from the dielectric insulating phase to a conductive phase via a sintering process, forming conductive traces that may be incorporated into electrical circuit(s). As described herein, a SLS process can be performed to use laser energy to precisely form the conductive traces. At operation 506, a thermally stabilizing ink is deposited into the transformable dielectric material and conductive traces. In one or more non-limiting embodiments, the thermally stabilizing ink is formed from a material containing polymerized trimethylolpropane ethoxylate triacrylate and BN particles. At operation 508, the thermally stabilizing ink is cured (e.g. using UV energy) to fix the conductive traces and obstruct further conversion of the transformable dielectric material into a conducting phase. The method ends at operation 510, at which point the electrical structures form a security barrier over the device under protection.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the embodiments as disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of forming a security barrier of an electronic device under protection, the method comprising:
    depositing a transformable dielectric material layer on the electronic device under protection;
    converting a target portion of the transformable dielectric material layer into at least one electrical circuit structure having at least one measurable electrical characteristic; and
    depositing a thermal stabilizing material layer onto the transformable dielectric material layer.

2. The method of claim 1, wherein forming the security barrier includes establishing a blended ratio of electrically conductive nanoparticles and electrically insulative nanoparticles in the transformable dielectric material layer.

3. The method of claim 2, wherein the electrically conductive nanoparticles include silver (Ag) nanoparticles and the electrically insulative nanoparticles include barium strontium titanate (BST) nanoparticles.

4. The method of claim 2, wherein the transformable dielectric material layer is cured at 80 degrees Celsius for 15 minutes.

5. The method of claim 2, wherein converting the target portion of the transformable dielectric material layer comprises performing a selective laser sintering (SLS) process to impinge laser energy on the transformable dielectric material layer to convert the target portion into the at least one electrical circuit structure.

6. The method of claim 5, wherein the laser energy melts the electrically conductive nanoparticles together to form an electrically conductive path defining the at least one electrical circuit structure.

7. The method of claim 6, wherein the electrically insulative nanoparticles electrically isolate the at least one electrical circuit structure from remaining portions of the transformable dielectric material layer.

8. The method of claim 1, wherein the thermal stabilizing material layer includes nanoparticles that obstruct the formation of additional conducting paths within the transformable dielectric material layer.

9. The method of claim 8, wherein the nanoparticles include Boron Nitride (BN) nanoparticles.

10. The method of claim 1, wherein the thermal stabilizing material layer reduces at least one of an amount and a size of air voids present in the transformable dielectric material layer.

11. The method of claim 10, wherein reducing the amount of air voids includes filling the air voids with polymerized trimethylolpropane ethoxylate triacrylate.

12. The method of claim 11, wherein the thermal stabilizing layer is cured through ultraviolet (UV) exposure to inhibit further changes to the security barrier layer at temperatures below 250 degrees Celsius.

13. A security barrier of an electronic device under protection, the security barrier comprising:

a transformable dielectric material layer on the electronic device under protection, the transformable dielectric material layer including a plurality of conductive nanoparticles and a plurality of insulative nanoparticles;

at least one electrical circuit structure comprising a portion of the conductive nanoparticles, the at least one electrical circuit structure having at least one measurable electrical characteristic; and a thermal stabilizing material layer covering the transformable dielectric material layer, including the at least one electrical circuit structure.

14. The security barrier of claim 13, wherein the at least one measurable electrical characteristic changes in response to altering the electrical circuit structure.

15. The security barrier of claim 14, wherein the at least one measurable electrical characteristic includes at least one of resistance, capacitance, and inductance.

16. The security barrier of claim 13, wherein the at least one electrical circuit structure is at a target portion of the transformable dielectric material layer, and the insulative nanoparticles electrically isolate the at least one electrical circuit structure from remaining portions of the transformable dielectric material layer.

17. The security barrier of claim 16, wherein the transformable dielectric material layer includes other electrical circuit structures.

18. The security barrier of claim 13, wherein the conductive nanoparticles include silver (Ag) nanoparticles, and the insulative nanoparticles include barium strontium titanate (BST) nanoparticles.

19. The electrical device of claim 18, wherein the thermal stabilizing material layer comprises a boron nitride (BN) material and a polymerized trimethylolpropane ethoxylate triacrylate material.

20. The electronic device of claim 19, wherein the transformable dielectric material layer and thermal stabilizing layer are combined to establish a composite substrate including a combination of Ag particles, BST particles, and BN particles.

* * * * *